United States Patent [19]
Koo

[11] Patent Number: 5,945,349
[45] Date of Patent: *Aug. 31, 1999

[54] METHOD OF ENABLING ANALYSIS OF DEFECTS OF SEMICONDUCTOR DEVICE WITH THREE DIMENSIONS

[75] Inventor: Jeong-Hoi Koo, Seoul, Rep. of Korea

[73] Assignee: Hyundai Electronics Industries Co., Ltd., Kyoungki-do, Rep. of Korea

[ * ] Notice: This patent is subject to a terminal disclaimer.

[21] Appl. No.: 08/684,453

[22] Filed: Jul. 19, 1996

[30] Foreign Application Priority Data

Jul. 19, 1995 [KR] Rep. of Korea ............... 95-21185

[51] Int. Cl.⁶ .................................................. B44C 1/22
[52] U.S. Cl. ................. 438/694; 216/60; 216/85
[58] Field of Search ................... 216/60, 85, 21; 438/4, 694; 250/307, 311

[56] References Cited

U.S. PATENT DOCUMENTS

| | | | |
|---|---|---|---|
| 4,836,883 | 6/1989 | Hatcher, Jr. | 156/627 |
| 5,131,752 | 7/1992 | Yu et al. | 356/369 |
| 5,191,213 | 3/1993 | Ahmed et al. | 250/310 |
| 5,214,283 | 5/1993 | Le | 250/307 |
| 5,480,812 | 1/1996 | Salisbury | 437/3 |
| 5,498,871 | 3/1996 | Koo et al. | 250/307 |
| 5,601,732 | 2/1997 | Yoshida | 156/345 L |

FOREIGN PATENT DOCUMENTS

| | | |
|---|---|---|
| 50-7912 | 3/1975 | Japan . |
| 55-69142 | 5/1980 | Japan . |
| 62-250421 A2 | 10/1987 | Japan . |

*Primary Examiner*—R. Bruce Breneman
*Assistant Examiner*—Anita Alankeo
*Attorney, Agent, or Firm*—Ware, Fressola, Van Der Sluys & Adolphson LLP

[57] ABSTRACT

A method of enabling analysis of defects of a semiconductor with three dimensions includes the steps of: coating a photoresist film on the passivation layer except a predetermined portion of the passivation layer including a portion where the defects exist; coating a vinyl film on the photoresist film and on the side of the wafer; removing the passivation layer on the second metal interconnect; and removing an insulating layer formed between two metal interconnects using a selective wet etching. The defects existing in the metal interconnects remaining after etching of the passivation layer and insulating layer are thereby observable, e.g., with a scanning electron microscope or equivalent, the wafer being set on a holder of the scanning electron microscope and being changed in tilt and rotational angles whereby the analysis is enabled.

5 Claims, 3 Drawing Sheets

METHOD OF ENABLING ANALYSIS OF DEFECTS OF SEMICONDUCTOR DEVICE WITH THREE DIMENSIONS

CROSS REFERENCE TO RELATED APPLICATIONS

Reference is made to co-owned, copending patent applications U.S. Ser. No. 08/684,454 entitled, "Method of Fabricating Specimen for Exposing Defects of a Semiconductor Device for Observation and Analysis", now U.S. Pat. No. 5,849,642 and U.S. patent Ser. No. 08/684,451 entitled, "Method of Fabricating Specimen for Analyzing Defects of Semiconductor Device", filed on even date herewith, now U.S. Pat. No. 5,840,205, and which are hereby incorporated by reference.

FIELD OF THE INVENTION

The present invention relates to improvements in enabling and facilitating a failure analysis of a patterned layer in a semiconductor device, and more particularly to a method of facilitating and enabling analysis of defects of a semiconductor device and wherein analysis of the defective die in three dimensions is enabled and facilitated without having to divide the die from a wafer after the formation of a semiconductor device is completed on a substrate thereof.

DESCRIPTION OF THE PRIOR ART

As a semiconductor device is highly integrated, each layer of a semiconductor device has evolved into a complicated, three dimensional array structure so as to maximize the storage capacity. Accordingly, observation from various perspectives is required to detect defects existing in such a wafer.

A window etching technology is known in which the purpose is to investigate defects of the patterned layers formed on a semiconductor substrate of the wafer. The technology applies a deprocessing method that continues to remove the formed layers from the upper layer to the lower layer one by one that exist over the defective position after etching a local portion of a wafer and exposing the etched portion. This method analyzes defects of the patterned layers with two dimensions. The above-mentioned window etching technology, however, has the shortcoming in that much time is required for the fabrication of the specimen to expose the defective layer. In addition, since the method preceding analysis of the defective layers comprises removing each layer according to the piled order from the uppermost layer to the final bottom layer having the defects, after the analysis of one layer is completed through the exposure by etching and the observation by microscopy, it has another shortcoming in that the defects may also be removed together with the removed objective layers, i.e., the upper layers overlying defects.

SUMMARY OF THE INVENTION

Accordingly, a first object of the present invention is to provide a method that enables and facilitates analysis of defects existing in the metal interconnect layer of an arbitrary die with three dimensions after the formation steps of the pattern layers are completed.

A second object of the present invention is to provide a method that enables and facilitates analysis of the defects existing in the polysilicon layers of a die with three dimensions after the formation steps of the pattern layers are completed.

According to the first object of the present invention, a method of enabling and facilitating analysis of defects of a semiconductor device with three dimensions where a double interconnect of first and second metals are formed with a passivation layer formed on the second metal and an insulating layer is formed between the first and second metals comprises the steps of: coating a photoresist film on the passivation layer except a predetermined portion of the passivation layer including a portion where the defects exist; coating a vinyl film on the photoresist film and on the side of the wafer; removing the exposed passivation layer on the second metal interconnect; and removing an insulating layer formed between two metal interconnects. The defects existing in said metal interconnects remaining after etching of said passivation layer and insulating layer are thereby observable with a scanning electron microscope or equivalent, particularly with said wafer being set on a holder of said scanning electron microscope with the holder being changeable in tilt and rotational angles, whereby said analysis is enabled and facilitated.

According to the second object of the present invention, a method for enabling and facilitating analysis of defects of a semiconductor device having a three dimensional structure, said semiconductor device being a memory device including a passivation layer, metal interconnects, insulating layers and plural polysilicon layers, said semiconductor device being formed as a wafer, comprises the steps of: coating a photoresist film on said wafer except leaving exposed a predetermined portion including a portion where the defects exist; coating a vinyl film on said photoresist film and on a side of said wafer; anisotropically etching the exposed portion until a contact portion of polysilicon for a storage node contact is exposed; removing said vinyl film; and removing said insulating layers between said polysilicon layers by selective wet etching; whereby defects existing in said polysilicon layers remaining after etching of said passivation layer and insulating layer are observable with a scanning electron microscope, particularly with said wafer being set on a holder of said scanning electron microscope with the holder being changeable in tilt and rotational angles whereby said analysis is enabled and facilitated.

BRIEF DESCRIPTION OF THE DRAWINGS

These and other features, aspects, and advantages of the present invention will become better understood with regard to the following description, appended claims, and accompanying drawings wherein:

DESCRIPTION OF THE PREFERRED EMBODIMENT

Hereinbelow, referring to the enclosed drawings, preferred embodiments of the present invention are described.

Figure 1A:
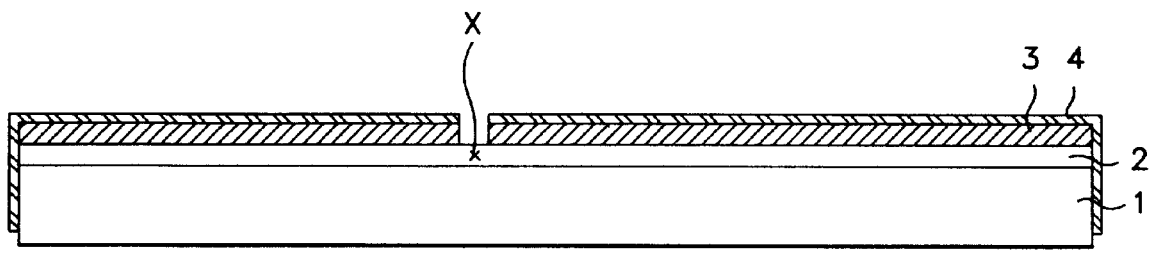
FIGS. 1A and 1B are views showing steps for analyzing the defects existing in the metal interconnects of a dynamic random access memory (DRAM) formed in a wafer according to a first embodiment of the present invention.

After the fabrication of a semiconductor device such as a DRAM is completed, any failures such as voids or an open contact are checked for using a bit map test. FIG. 1A shows a case where the check found failures appearing at insulating layer or metal layers formed on a wafer of silicon 1. The failed position is expressed as symbol "X" in FIG. 1A.

A first step is to coat a photoresist film 3 on a patterned layer 2 of a wafer except where the portion X is formed. The step of coating the photoresist film 13 is to prevent damage to the surface of the test specimen during a following etching step. The reason the photoresist film is used is that it has an advantage in that it can be removed easily and safely. For example, the photoresist film can be easily removed by a selective wet etching using Acetone. In addition, although a baking step of the photoresist film may be completed, the film could thus also be removed by a dry etching using $O_2$ gas. In the present embodiment, such a baking step in the temperature range of 60° to 70° C. which would be used to harden the coated photoresist film is not done.

After the coating step of the photoresist film is completed, the photoresist film is covered with a vinyl film that has the same size as that of wafer 4. Afterwards, all of the layers on the objective layer for the analysis are removed. Since most semiconductor devices have a passivation layer for the protection of the metal interconnect, a first etched layer is the passivation layer, being positioned at the highest place of the patterned layer 2, which is removed by a dry etching. The supply gas for the etching is a mixture of $CF_4$ and $O_2$ with a respective ratio of 10:1.

After the passivation layer is removed, two etching technologys are alternatively applied according to the failure mode. That is, whether the failure mode is a global characteristic generated in the double metal interconnects or a partial characteristic generated in polysilicon of four layers, specific etching technology is selected.

Figure 1B:
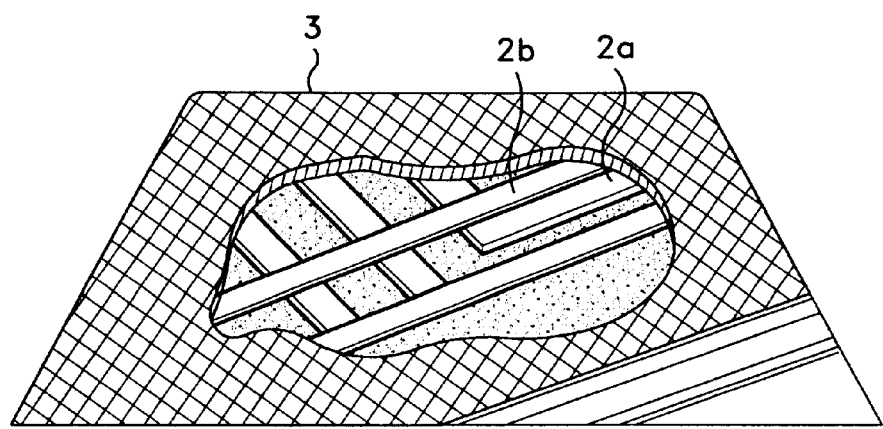

FIG. 1B is an application of the present invention when global failure exists in the double metal interconnects. In the centered sectional area, the upper layer is a second metal interconnect 2b, the lower layer is a first metal interconnect 2a, and a portion which is not exposed, is a photoresist layer 3. In addition, there exists an insulating layer between the first and the second metal interconnects.

The insulating layer in this case is removed by a plasma etching method using a reactive ion etcher. The supply gas for removing the insulating layer is the mixture of gases $CF_4$ and $O_2$ also used in removing the passivation layer. After the etching steps are completed, defects in the metal interconnects can be observed in three dimensions by controlling tilt and rotational angles of scanning electron microscopy. E.g., the defects existing in the metal interconnects remaining after etching of the passivation layer and insulating layer are observable with a scanning electron microscope. The wafer can be set on a holder of the microscope with the holder being changeable in tilt and rotational angles for better observation.

Figure 2A:
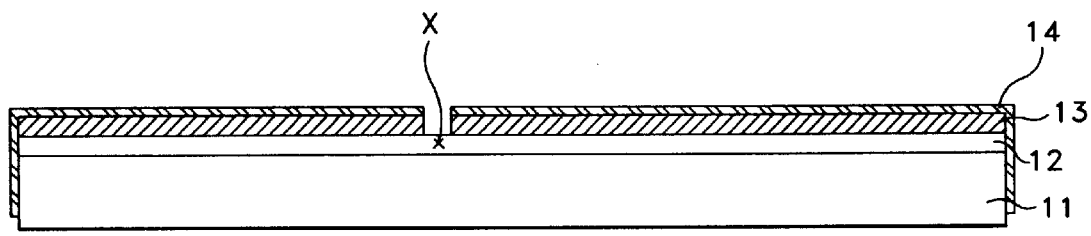
FIGS. 2A to 2D are views showing steps for analyzing the defects existed in the polysilicon layer of a DRAM formed in a wafer according to a second embodiment of the present invention.

FIG. 2A is a case that applies the present invention for the case where a partial failure exists in the polysilicon layers. As shown in FIG. 2A, the patterned layer 12 formed on the silicon substrate 11 includes four polysilicon layers. Four polysilicon layers include a first polysilicon(poly 1) for gate electrode, a second polysilicon(poly 2) for bit line, a third polysilicon(poly 3) for storage node contact, and a fourth polysilicon(poly 4) for capacitor positioned above the storage node contact. In FIG. 2A, there also exists a photoresist layer 13 and a vinyl film 14.

The passivation layer(not shown in Figures) is first removed using the same method noted hereinbefore. Afterwards, upper layers including poly 4 and dielectric layer for capacitor are removed by the supply gases of $CF_4+O_2$.

Figure 2B:
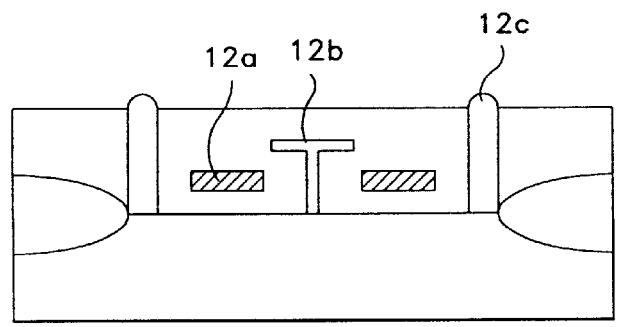

FIG. 2B shows a state when the etching step is completed. As shown in FIG. 2B, symbol 12a is a poly 1 that is contact with the word line, 12b is a poly 2(or bit line) of which is contact with drain region, and 12c is a contact portion of a poly 3 which is contact with source region for the formation of the storage capacitor.

Figure 2C:
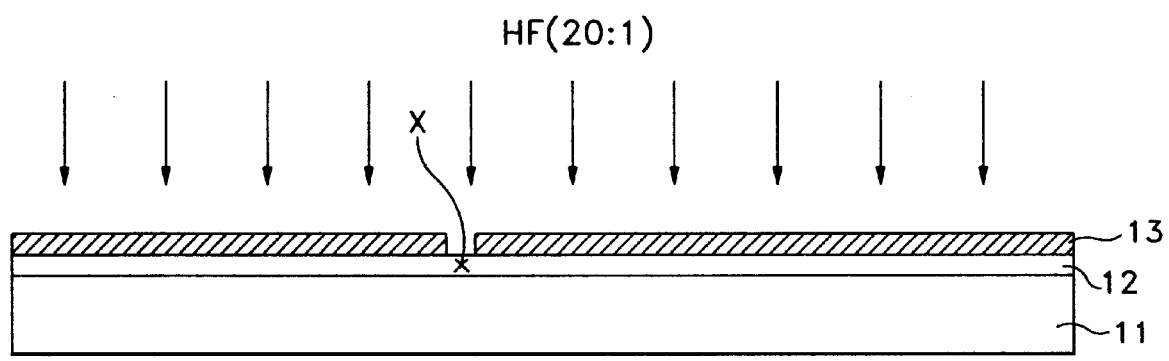
Figure 2D:
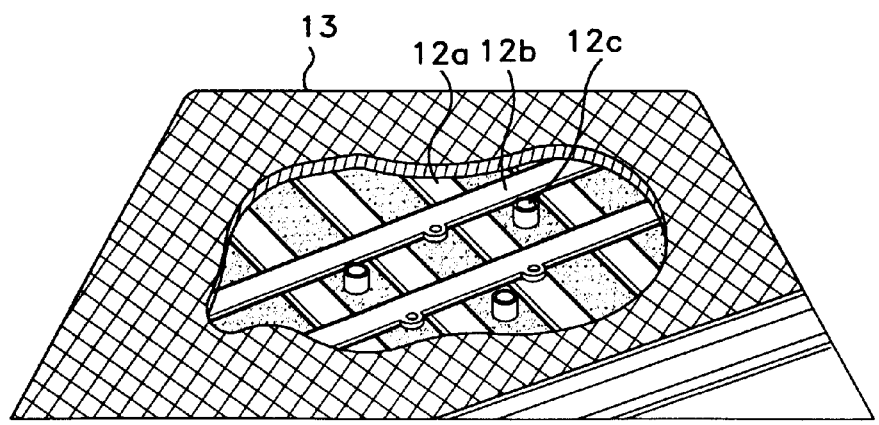

It is possible to analyze defects between polysilicon layers with three dimensions by applying an selective etching technology called to 3-D Polysilicon Skeleton Reverse Delineation. The selective etching technology using 3-D Polysilicon Skeleton Reverse Delineation was also applied in U.S. Pat. No. 5,498,871. To further explain, the storage node except a contact 12c shown in FIG. 2B is removed using the plasma etcher of a barrel type, in which the supply gases for the etching are the mixed combination of $CF_4$ and $O_2$. Afterwards, the oxide films are removed by a solution of diluted HF(mixing ratio of 20:1) that has a high etching selection ratio of oxide film to polysilicon layer, resulting in the exposure of polysilicon layers. As shown in FIG. 2C, the selective etching step of the oxide films by a solution of dilute HF is performed in a state where the photoresist film 13 is coated after the vinyl film 14 is removed. As shown in FIG. 2D, after the oxide is completely removed, the polysilicon layers 12a, 12b, 12c remain on the substrate are shown in FIG. 2D.

After the fabrication of a specimen for the analysis of defects are completed through the above steps, defects in polysilicon layers can be observed using SEM. Defects existing in the polysilicon layers remaining after etching of the passivation layer and insulating layer are observable with a scanning electron microscope, particularly with the wafer being set on a holder of the scanning electron microscope with the holder being changeable in tilt and rotational angles. Furthermore, other apparatus for the inspection of particles such as KLA or Tensor at the same axis can be used interchangeably i.e., equivalently with SEM for both this embodiment and the first embodiment.

Positions of the inspected defects are compared with positions of particles or defects which are observed during the progress of the process for the fabrication of semiconductor device. The analysis of defects is then possible through the comparison, so that the method of the present invention can contribute to the establishment of the optimized defects analysis.

As described previously, when defects exist in any die in which the patterned layers are formed thereon, the present invention makes it possible to analyze the defects by exposing the local portion without dividing the die from a wafer state. Therefore, when other apparatus for the inspection of particles such as KLA or Tensor is used interchangeably with SEM, the present invention makes it possible to compare the analyzed data with physical defects or particles data obtained during the progress of the process for the fabrication of a semiconductor device. Accordingly, the present invention can be used to establish a system for the statistical analysis of defects.

Although the preferred embodiment of the present invention has been disclosed for illustrative purposes, those skilled in the art will appreciate that various modifications, additions and substitutions are possible, without departing from the scope and spirit of the present invention as disclosed in the accompanying claims.

What is claimed is:

1. A method of enabling analysis of defects of a semiconductor device where a double interconnect of first and second metals are formed with a passivation layer formed on the second metal and an insulating layer is formed between the first and second metals, comprising the steps of:

coating a photoresist film on the passivation layer except leaving exposed a portion of the passivation layer including a portion where the defects exist;

coating a vinyl film on the photoresist film and on a side of the wafer;

removing the exposed portion of the passivation layer on the second metal interconnect; and removing an insulating layer formed between two metal interconnects, whereby the defects existing in said metal interconnects remaining after said step of removing said passivation layer and said step of removing insulating layer are observable with a scanning electron microscope, particularly with said wafer being set on a holder of said scanning electron microscope with the holder being changeable in tilt and rotational angles.

2. The method according to claim 1, wherein supply gases for etching said passivation layer are $CF_4$ and $O_2$ that the ratio is 10:1.

3. The method according to claim 1, wherein said insulating layer is etched by a reactive ion etching method.

4. A method of enabling analysis of defects of a semiconductor device, said semiconductor device being a memory device including a passivation layer, metal interconnects, insulating layers and plural polysilicon layers, said semiconductor device being formed as a wafer, comprising the steps of:

coating a photoresist film on said wafer except leaving exposed a portion including a portion where the defects exist;

coating a vinyl film on said photoresist film and on a side of said wafer;

anisotropically etching the exposed portion until a contact portion of polysilicon for a storage node contact is exposed;

removing said vinyl film; and removing said insulating layers between said polysilicon layers by selective wet etching, whereby defects existing in said polysilicon layers remaining after said step of removing said passivation layer and said step of removing said insulating layer are observable with a scanning electron microscope, particularly with said wafer being set on a holder of said scanning electron microscope with the holder being changeable in tilt and rotational angles.

5. The method according to claim 4, wherein a solution for said wet etching is composed of HF and water, in which mixing ratio is 1:20.

* * * * *